United States Patent
Takahashi

(10) Patent No.: US 7,090,754 B2
(45) Date of Patent: Aug. 15, 2006

(54) SPUTTERING DEVICE

(76) Inventor: Nobuyuki Takahashi, Highashihashimoto Corporus 1-113, 3-2-7, Higashihashimoto, Sagamihara, Kanagawa, 229-1104 (JP)

(*) Notice: Subject to any disclaimer, the term of this patent is extended or adjusted under 35 U.S.C. 154(b) by 148 days.

(21) Appl. No.: 10/331,903

(22) Filed: Dec. 31, 2002

(65) Prior Publication Data
US 2004/0089534 A1 May 13, 2004

(30) Foreign Application Priority Data
Nov. 8, 2002 (JP) .............................. 2002-324895

(51) Int. Cl.
*C23C 14/35* (2006.01)
(52) U.S. Cl. .................... 204/298.28; 204/298.23; 204/298.26; 204/298.12; 204/192.12
(58) Field of Classification Search ............ 204/192.12, 204/298.19, 298.2, 298.23, 298.26, 298.28, 204/298.12
See application file for complete search history.

(56) References Cited

U.S. PATENT DOCUMENTS

| | | | | |
|---|---|---|---|---|
| 3,502,562 A * | 3/1970 | Humphries | ............ | 204/298.12 |
| 3,616,451 A * | 10/1971 | Gallez | .................... | 204/298.26 |
| 4,094,764 A * | 6/1978 | Boucher et al. | ....... | 204/298.06 |
| 4,407,894 A * | 10/1983 | Kadokura et al. | .......... | 428/457 |
| 6,143,149 A * | 11/2000 | Abe | ....................... | 204/298.26 |
| 6,641,702 B1 * | 11/2003 | Shi et al. | ................ | 204/192.12 |

* cited by examiner

*Primary Examiner*—Rodney G. McDonald
(74) *Attorney, Agent, or Firm*—Wenderoth, Lind & Ponack, L.L.P.

(57) ABSTRACT

An object of the invention is to provide a method of sputtering and a device for sputtering which can improve distribution of a film's thickness and coverage distribution improve. The device for sputtering includes at least a substrate, a substrate holder which holds the substrate, a target for forming a thin film on the substrate, a sputtering cathode in which the target is installed, a means for sputtering which makes materials of the target sputter to the substrate. Sputtering is carried out by making the substrate holder rotate and making a sputter cathode unit comprising at least one sputtering cathode move along an arc over the rotating substrate held on the substrate holder.

21 Claims, 6 Drawing Sheets

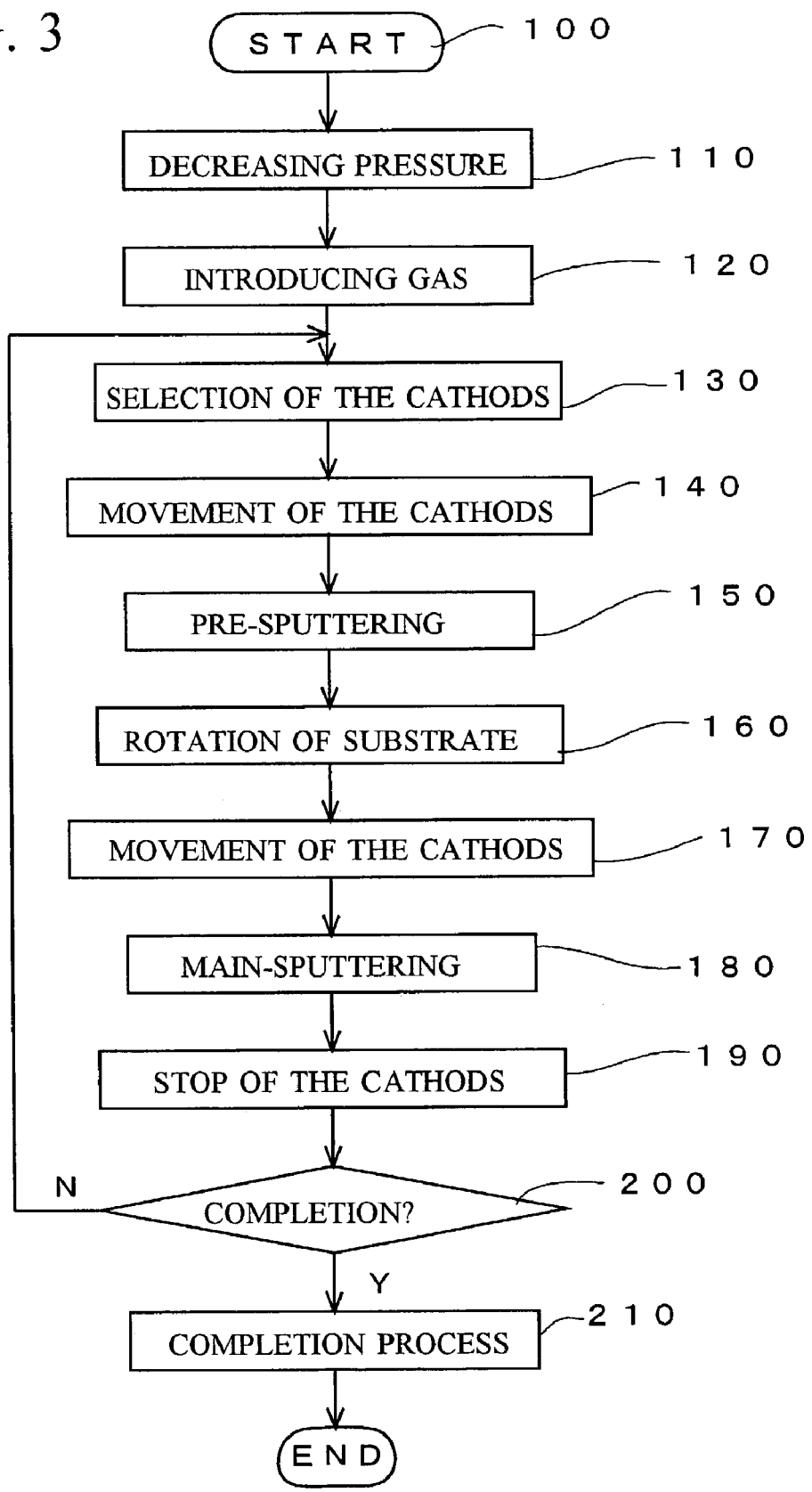

SPUTTERING DEVICE

BACKGROUND OF THE INVENTION

1. Technical Field

This invention relates to a method of sputtering and a device for sputtering, which is constituted of at least a substrate and a target for forming a thin film on the substrate. Ionized gas is smashed up to the target and atoms and/or molecules emitted from the target adhere to the substrate to form the thin film thereon.

2. Description of the Related Art

JP 11-335835 A discloses a sputtering device in which, in order to improve the evenness of a film's thickness, a disc-shaped target and a substrate on which a film is formed are provided so as to face each other, and the substrate rotates while revolving on the target. The substrate is rotated so as to change an area overlapped between the target and itself from the last overlapped area. In the sputtering device disclosed in this reference, the target is larger than the substrate in order to improve the evenness of the film's thickness on the substrate. In the case that concavities and convexities exist on the substrate, the thickness of the film formed in the concavity is not even, so that a problem such as worse coverage distribution arises.

JP 2001-262336 A discloses a sputtering device in which, in order to ensure evenness of a film's thickness over a wide range of a large-sized substrate, impedance of a second adjustment circuit is adjusted so as to bring a direct-current component of a potential of a substrate holder close to an electrical potential of plasma to form a thin film of an insulator. In this device, a specific angle is formed between the target and a surface of the substrate holder, and a center of the target is not identified with a center of the substrate holder. In the sputtering device disclosed in this reference, because a distance between a surface of the substrate and the target is inhomogeneous, even if the substrate is revolved and rotated, operation for a potential difference between a cathode and the target and/or operation for an impedance of the adjustment circuit must be strictly controlled. Therefore, a problem such as complex operation arises.

JP 2002-20864 A discloses a sputtering device in which a substrate and a target are located so as to rush (emit) the sputtered particles to the substrate, and the substrate is rotated so that a magnetic film with a high anisotropic rate can be formed uniformly. In the sputtering device disclosed in this reference, because materials emitted from the target are restricted by a plate for modifying distribution, a thin film can be formed on the substrate. However, a problem such as availability of the target being very inefficient arises. Besides, there is a problem in that the film is thicker in a center portion of the substrate because the center portion thereof is a common portion in every target.

JP 2002-20866 A discloses that, in a sputtering device which sputters to an object by generating a magnetic field on a target and applying an electric field to the target, a means for generating the magnetic field is located adjacent to the target and comprises a plurality of magnets which rotate complexly so as to combine rotation and revolution. In the sputtering device disclosed in this reference, the plural magnets located at the back of the target are rotated complexly (i.e., in a complex manner) to change the magnetic field complexly. However, the complex change of the magnetic field makes electrons moving like a cyclone on the target work in a complex manner, so that the magnetic field and the electric field are not certain. As a result, an erosion extent on the target causes evenness, but smashing directions of atoms from the target are not uniform, and a problem such that distribution of the film's thickness and coverage distribution of the substrate are not uniform arises.

SUMMARY OF THE INVENTION

Due to the above mentioned problems, an object of the invention is to provide a method of sputtering and a device for sputtering which can improve a film's thickness distribution and coverage distribution.

Accordingly, a method of sputtering in this invention comprises, in a device for sputtering constituted of at least a substrate, a substrate holder for holding the substrate, a target for forming a thin film on the substrate, a sputtering cathode in which the target is installed, a means for sputtering which sputters a material of the target to the substrate, a step of making the substrate rotate and a step of making a sputtering cathode unit comprising at least one sputtering cathode move along an arc over the rotating substrate held on the substrate holder and sputter. That is to say, a method of sputtering according to the invention is unique in making the substrate holder rotate and in making the sputtering cathode unit move along the arc over the substrate on the rotating substrate holder to sputter.

The sputtering cathode unit moves, passes, or reciprocates over the substrate at least once.

Furthermore, a device for sputtering is constituted of at least a substrate, a substrate holder which holds the substrate, a target for forming a thin film on the substrate, and a sputtering cathode in which the target is installed. In addition, the device comprises a means for rotation (substrate holder rotating device) which makes the substrate holder holding the substrate rotate, a sputtering cathode unit comprising at least one sputtering cathode, a means for movement (a driving mechanism) which makes the sputtering cathode unit move along an arc of a circle over the rotating substrate held by the substrate holder, and a means for sputtering (sputtering system) which sputters as the sputtering cathode unit moves over the rotating substrate by the means for movement. Thus, the device can carry out the above mentioned method for sputtering concretely.

The means for movement is preferably constituted of a means for driving such as an electric motor and an arm portion turned by the means for driving, in a front end of which the sputtering cathode unit is provided.

It is preferred that the sputtering cathode has a nozzle portion projecting to the substrate. The nozzle portion is also preferably cylindrical, but the shape of the nozzle portion is not limited in this invention. Concretely speaking, it is preferred that the nozzle portion be a cylindrical shape in which the diameters thereof is uniform, the diameter be gradually larger toward its end, the diameter be gradually smaller toward its end, the diameter be gradually smaller toward its middle portion, or the diameter be gradually larger toward its middle portion. Furthermore, it is preferred that the nozzle portion be barrel-shaped so as to bulge in a middle portion thereof like an arc, be bellbottom-shaped, or be bellows-shaped. Thus, it is preferred that the most suitable shape of the nozzle portion is selected based on sputtered materials, a size of the substrate, and so on.

It is preferred that the means for movement makes the sputtering cathode unit move, pass, or reciprocate over the substrate at least once. Moreover, it is preferred that a movement speed of the sputtering cathode unit and a rotation speed of the substrate are controlled suitably by a control means. The condition such as the number of times, the speed and so on of movement, passage or reciprocation are selected suitably based on sputtered materials, the thickness of the forming film, the shape of the substrate and so on.

It is preferred that sputtering cathode units be provided on a front end of a plurality of arms extending from a rotation shaft constituting the driving mechanism, and turn with the center at the rotation shaft. Thus, a plurality of sputtering cathode units can sputter to the substrate. Furthermore, it is preferred that the sputtering cathode unit be constituted of a plurality of sputtering cathodes. It is preferred that the same kind of targets be installed in the sputtering cathodes respectively, or different kinds of targets be installed in the sputtering cathodes respectively. If the same kind of targets are installed, the thickness of the film formed once can be increased. If different kinds of targets are installed, an alloy can be formed once, and further, a mixed thin film can be formed.

A magnet generating a magnetic field is, preferably, provided in the sputtering cathode.

Moreover, it is preferred to be provided with a means for a pre-sputter which makes the target in the sputtering cathode discharge electricity prior to sputtering to the substrate. Thus, because oxides, etc. that adhere to a surface of the target can be removed, a quality of the film formed at the main-sputter can be improved.

The means for pre-sputter is, preferably, provided with a means for detection which detects a condition of sputtering, and a means for adjustment which judges a condition of sputtering according to the result detected by the means for detection and adjusts factors in a main-sputter (sputtering to the substrate) such as applied electric power, a movement speed of the sputtering cathode unit, and/or a rotation speed of the substrate.

BRIEF DESCRIPTION OF THE DRAWINGS

The various features which characterize the invention are pointed out with particularity in the claims annexed to and forming a part of this specification. For a better understanding of the invention, its operating advantages, and specific objects attained by its use, reference should be had to the accompanying drawings and descriptive matters which illustrate and describe preferred working modes of the invention, and in which:

FIG. 3 is a flowchart diagram showing one example of the operation of the device for sputtering according to the invention;

DETAILED DESCRIPTION OF THE INVENTION

Hereinafter, embodiments of this invention are explained with respect to the drawings.

Figure 1:
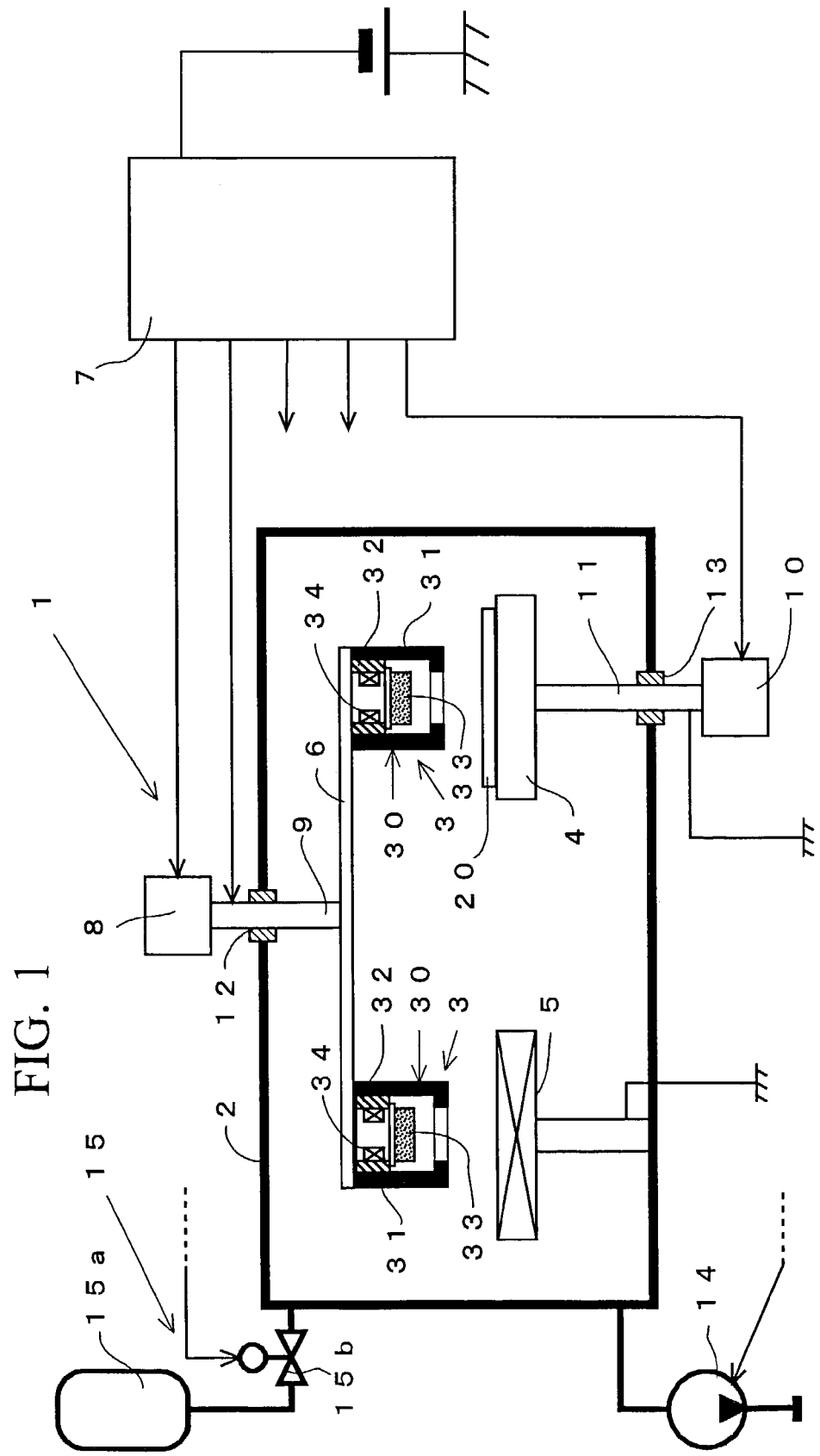
FIG. 1 is a diagrammatic illustration of a device for sputtering according to the invention.

A device for sputtering 1 shown in FIG. 1 has a vacuum chamber 2. The vacuum chamber 2 has sputtering cathode units 3 which are each provided with a sputtering cathode 30, a substrate holder 4 holding a substrate 20, and a mechanism for pre-sputter 5 therein.

Figure 2:
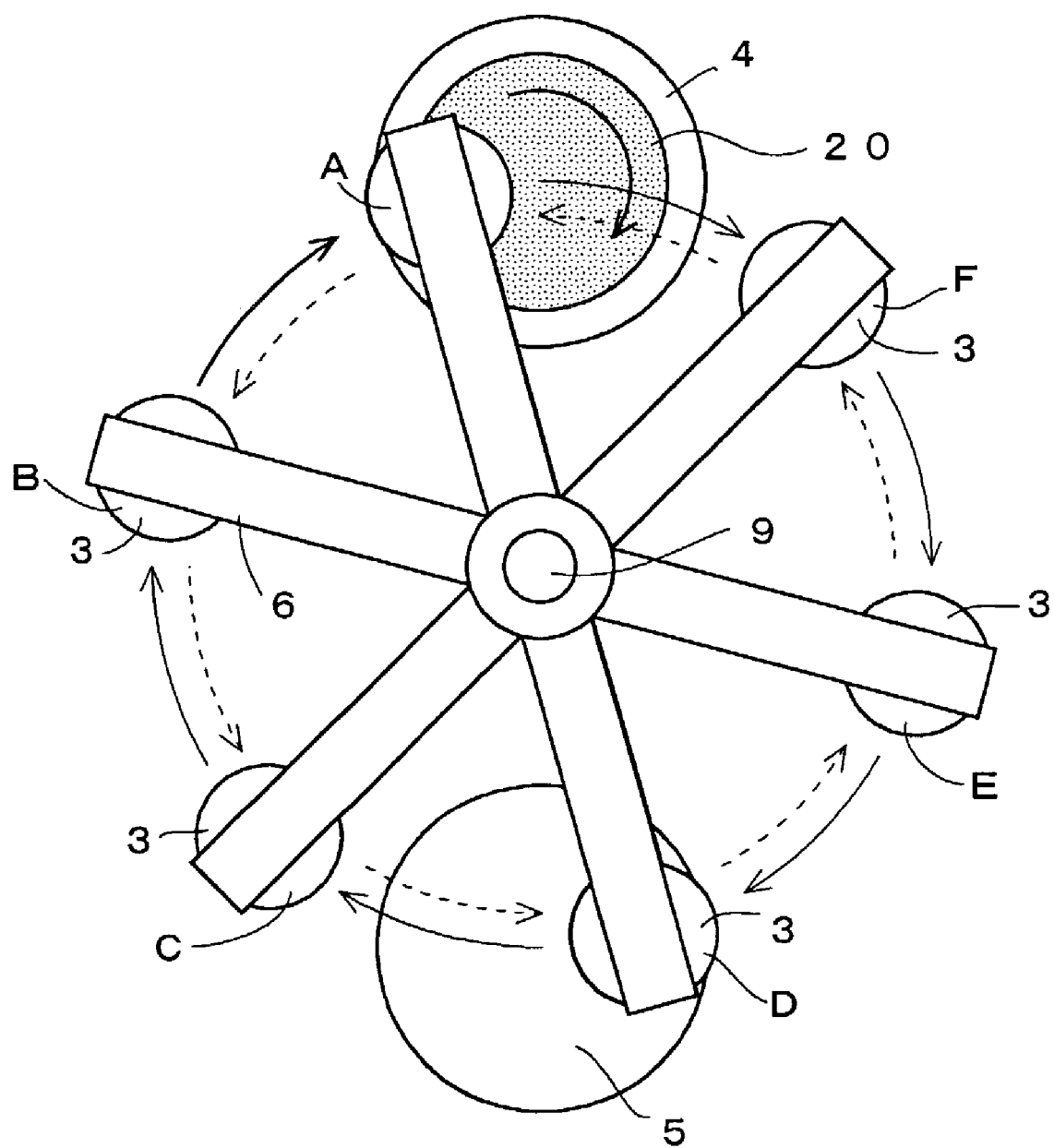
FIG. 2 is a schematic representation illustrating one example of an arrangement of the sputtering cathode unit in the device for sputtering according to the invention.

In this working mode, as shown in FIG. 2, the sputtering cathode units 3 are, respectively, provided on front ends of a plurality of arms 6 radially extending from a rotation shaft 9 of an electric motor 8 which is operated by a control unit 7. Thus, the arms 6 can be turned with their center at the rotation shaft 9 in both directions.

The substrate holder 4 is connected to a rotation shaft 11 of an electric motor 10 which is operated by the control unit 7, so that the substrate holder 4 rotates by rotation of the electric motor 10. Note that the rotation shafts 9 and 11 are secured rotatably via seal mechanisms 12 and 13 in the vacuum chamber 2.

The vacuum chamber 2 is provided with a vacuum pump 14 operated by the control unit 7, and a mechanism for supplying gas 15 which supplies gas for sputtering (argon gas in this embodiment). In this embodiment, the mechanism for supplying gas is constituted of a gas receiving tank 15$a$ and an electromagnetic on-off valve 15$b$ operated by the control unit 7. Note that there is an inert gas such as argon, xenon, or a mixture gas of the inert gas and oxygen or nitrogen as a gas for sputtering.

Furthermore, the sputtering cathode 30 is constituted of a grounded shield portion 31, a target 33 which is located in the shield portion 31 and to which electric power is applied, a magnet portion 34 located behind of the target 33, and insulation 32 between the shield portion 31 and the magnet portion 34. Cooling water and electric power are supplied via the rotation shaft 9 and arms 6 to the sputtering cathodes 30.

The substrate holder 4 is grounded via the rotation shaft 11. Note that, in this working mode (embodiment), the ground is an anode for applying a minus voltage to the target 33, but there is a case in which a certain voltage is applied between the substrate holder 4 and the ground side.

Due to the above mentioned constitution, the device for sputtering 1 according to this invention is operated, for instance, as shown in a flowchart which starts from step 100 in FIG. 3.

In step 110, a pressure in the vacuum chamber 2 is decreased to $1 \times 10^{-4}$ Pa ($8 \times 10^{-7}$ Torr) by operation of the vacuum pump 14. Next, in step 120, by operating the electromagnetic on-off valve 15$b$, argon gas is introduced until the pressure in the vacuum chamber 2 reaches to $1 \times 10^{-1}$ Pa ($5 \times 10^{-3}$ Torr). In step 130, the sputtering cathode unit 3 (A–F) shown in FIG. 2 that is to be used is selected. In step 140, the electric motor 8 is operated to make one of the sputtering cathode unit 3 (A–F) selected in step 130, in which a desired target (for instance, 100 50 mm Ta target) is installed, move to the mechanism for pre-sputter 5. In step 150, pre-sputter is carried out by applying electric power to the selected sputtering cathode unit. Thus, oxide and so on that is located on the surface of the target can be removed (cleaning). Note that it is preferred that the mechanism for pre-sputter 5 be grounded and set so as to create the same condition as discharge to the substrate 20. In addition, specific sensors are located to detect any conditions of the pre-sputter, and it is preferred to carry out a good sputtering on the substrate by adjusting voltage, concentration of gas, and so on.

Figure 4A:
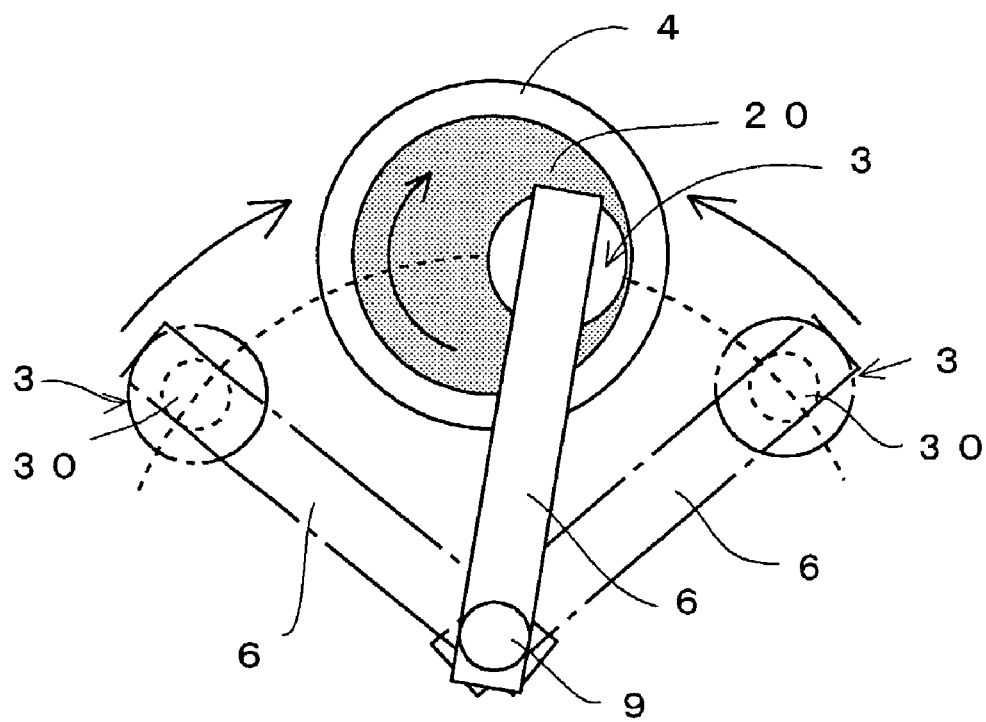
FIGS. 4A and 4B are schematic illustrations showing a sputtering method according to the invention.
Figure 4B:
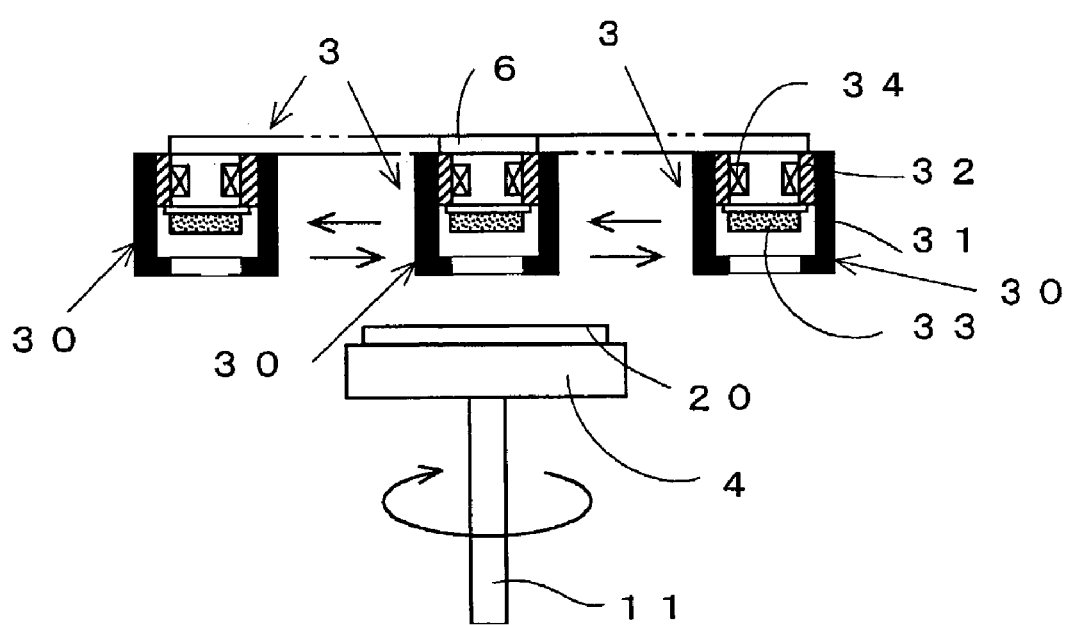

Then, in step 160, the electric motor 10 is operated to make the substrate (for instance, φ200 mm Si substrate) 20 held on the substrate holder 4 rotate with a specific rotation speed, for instance, 10 rpm. In step 170, the selected sputtering cathode unit 3 or sputtering cathode 30 is located near or adjacent to the substrate holder 4, and then, in step 180, electric power (for instance, 100 WDC) is applied, as shown in FIGS. 4A and 4B, and the sputtering cathode unit 3 is moved along a surface of the substrate on which a thin film is formed and in an arc orbit passing over the substrate 20 with an operating movement speed (0.1 rpm–1 rpm) (main-sputtering). It is basically preferred that the sputtering cathode unit 3 moves, passes, or reciprocates over the substrate at least once.

The sputtering cathode unit 3 is stopped in step 190, and whether or not the sputtering operation is completed is determined in step 200. When the operation is continued (N), the above mentioned work is repeated by returning to step 130. In this case, a desired sputtering cathode unit 3 or the sputtering cathode 30 is selected, and then the working is continued. When completion of the operation is determined (Y), going to step 210, the work is completed by terminating the supply of electric power, discharging the argon gas, and returning to a normal pressure in the vacuum chamber 2.

Due to the above operation, 0.7 μm of the film's thickness was gained. In addition, the same thickness of an aluminum film can be formed due to the same process with another Si substrate 20 and Al target 33. As a result, in the Ta film and the Al film, distribution of the film's thickness was improved from ±4–2% in a prior method to ±0.7–0.2%, the number of particles on the substrate was decreased ⅟₃₀ as compared with the case in the prior art method, and a rate of forming film became ⅔. The film's thickness becomes even by rotation of the substrate 20 and revolution of the target 33, and it means that the coverage distribution is improved.

Figure 5:
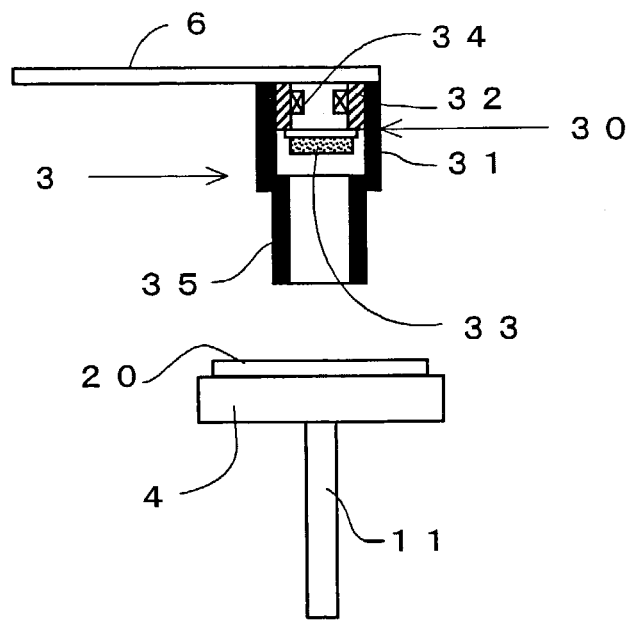
FIG. 5 is a schematic illustration showing a sputtering cathode provided with a nozzle portion at a front end of a shield.

In the embodiment shown in FIG. 5, a nozzle portion 35 is provided on a front end of the shield 31. Thus, because a rate of sputtering particles in a vertical direction can be increased, the distribution of the film's thickness and the coverage distribution are further improved, and unnecessary sputtering particles can adhere to an inner surface of the nozzle portion 35, so that cleaning maintenance of the device can be facilitated.

FIGS. 6A–6D show modified embodiments of the nozzle portion 35.

Figure 6A:
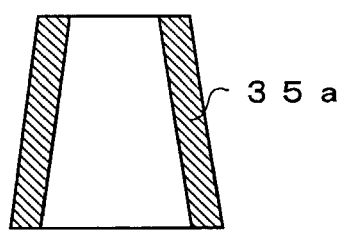
FIGS. 6A, 6B, 6C and 6D are illustrations showing modifications of the nozzle portion.
Figure 6B:
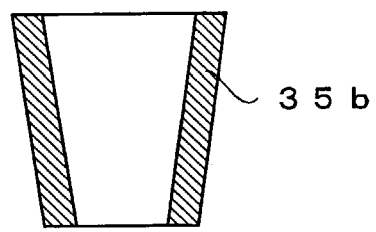
Figure 6C:
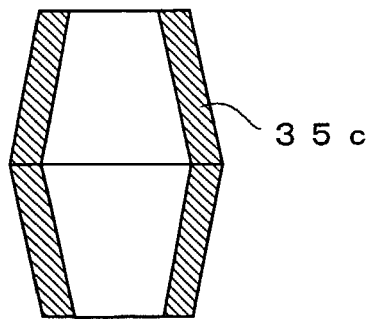
Figure 6D:
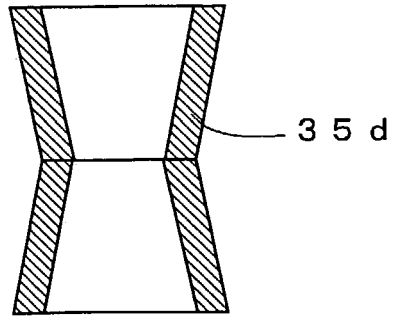

FIG. 6A shows a nozzle portion 35a with a gradually enlarged diameter toward a front end thereof. FIG. 6B shows a nozzle portion 35b with a gradually reduced diameter toward a front end thereof. FIG. 6C shows a nozzle portion 35c with a gradually enlarged diameter toward a middle portion thereof. FIG. 6D shows a nozzle portion 35d with a gradually reduced diameter toward a middle portion thereof. As other embodiments, but not shown in the figures, the nozzle portion is shaped so that the side surface is bulged, the barrel-shaped, bell-bottom-shaped, or a bellows-shaped so as to repeat enlargement and reduction of the diameters as a wave shape in a side surface thereof. They are selected suitably based on the type of targets, features of the substrate, thickness of the film and so on.

Figure 7:
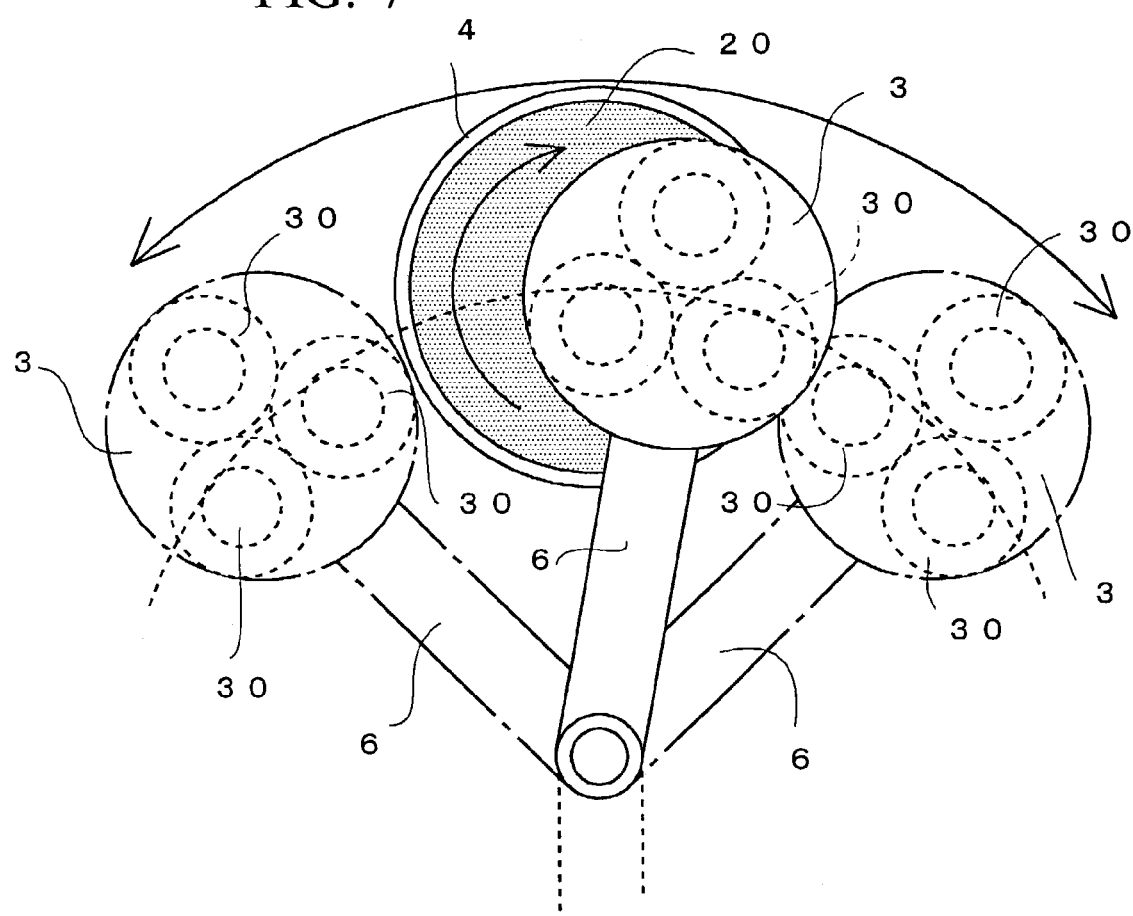
FIG. 7 is a schematic illustration showing a working mode in which the sputtering cathode unit is constituted of a plurality of sputtering cathodes.

FIG. 7 shows an embodiment in which the sputtering cathode unit 3 comprises a plurality of (in this working mode, three) sputtering cathodes 30. In this case, when the sputtering cathodes 30 have the same kind of targets 33, respectively, a rate of forming film can be increased and the sputtering can be carried out over a wide range. Therefore, working time can be reduced and the distribution of the film's thickness and the coverage distribution are further improved.

When the sputtering cathodes 30 have different targets 33, respectively, it can be possible to form an alloy or a mixture thin film. Furthermore, by changing sizes of the targets 33 in the sputtering cathode 30, and/or by adjusting electric power supplied to each sputtering cathode 30, it can be possible to easily change a rate of alloy and a mixture rate of the mixture thin film.

Moreover, the distribution of the film's thickness and the coverage distribution can be further improved by rotating the sputtering cathode unit 3 itself.

Regardless of the number of sputtering cathodes 30, it can be possible to form an insulated film by providing a high frequency power source with an adjustment device in the target side rotation shaft 12.

Furthermore, due to applying DC or high frequency bias to the substrate holder 4, bias-etching to the substrate is possible, so that a high density thin film can be formed.

In this embodiment, however, although argon gas is used as a process gas for forming the film, not only argon gas but also a mixture gas of an inert gas and oxygen or nitrogen can be used.

A device according to this invention can be installed to not only a batch device but also a cluster device.

The above mentioned device for sputtering according to the embodiments of this invention is such that the substrate 20 and the target 33 are arranged horizontally, but a device for sputtering as another embodiment is constituted so that the substrate 20 and the target 33 are located approximately vertically in the same constitution as the device for sputtering shown in FIG. 1.

In the so-called vertical type of device for sputtering 1, when films of Ta and Al are formed in the same condition as the above case, distribution of the film's thickness was improved from ±4–2% in a prior method to ±0.7–0.2%, the number of particles on the substrate was decreased ⅟₅₀ as compared with the case in the prior art method, and a rate for forming film became ⅔. As the rate of sputtering articles going straight on the substrate 20 increases, it means that the coverage distribution is improved.

As explained above, according to this invention, to make the substrate rotate and the target move along an arc over the substrate, the distribution of the film's thickness and the coverage distribution can be improved.

Furthermore, by providing the nozzle portion, it is possible to improve the distribution of the film's thickness and the coverage distribution and to adhere unnecessary sputtering particles to the inner surface of the nozzle portion, so that cleaning maintenance can be facilitated.

What is claimed is:

1. A sputtering device comprising:
   a vacuum chamber;
   a substrate holder for holding a substrate within said vacuum chamber;
   a substrate holder rotating device for rotating said substrate holder and the substrate to be held by said substrate holder;
   a plurality of sputtering cathode units, each of said sputtering cathode units including a plurality of sputtering cathodes, each of said sputtering cathodes having a target arranged to face the substrate to be held by said substrate holder so that said target is sputtered to form a film on the substrate;
   a driving mechanism for moving said sputtering cathode units along an arcuate path across a surface of the substrate to be held by said substrate holder; and
   a sputtering system for sputtering at least one target as at least one of said sputtering cathode units moves across the substrate held by said substrate holder rotated by said substrate holder rotating device, said sputtering system being operable to independently adjust electric power to be supplied to each of said sputtering cathodes of each of said sputtering cathode units.

2. The sputtering device of claim 1, wherein each of said sputtering cathode units further includes a magnet for generating a magnetic field.

3. The sputtering device of claim 2, wherein each of said sputtering cathode units further includes a shield surrounding the targets of said sputtering cathodes, and includes a nozzle portion projecting from an end of said shield toward the substrate to be held by said substrate holder.

4. The sputtering device of claim 3, wherein said driving mechanism includes a plurality of arms extending in a radial direction from a rotation shaft, said driving mechanism being operable to rotate about a longitudinal axis of said rotation shaft, each of said sputtering cathode units being located at an end of a respective one of said arms.

5. The sputtering device of claim 4, further comprising a pre-sputtering unit for pre-sputtering the at least one target prior to sputtering the at least one target at the substrate to be held by said substrate holder.

6. The sputtering device of claim 5, wherein said driving mechanism is operable to move at least one of said sputtering cathode units along an arcuate path across a surface of the substrate in a reciprocating manner for a plurality of passes during sputtering of the at least one target.

7. The sputtering device of claim 5, wherein said sputtering cathodes of each of said sputtering cathode units have the same type of target.

8. The sputtering device of claim 5, wherein said sputtering cathodes of each of said sputtering cathode units have different types of targets.

9. The sputtering device of claim 2, wherein said driving mechanism includes a plurality of arms extending in a radial direction from a rotation shaft, said driving mechanism being operable to rotate about a longitudinal axis of said rotation shaft, each of said sputtering cathode units being located at an end of a respective one of said arms.

10. The sputtering device of claim 9, further comprising a pre-sputtering unit for pre-sputtering the at least one target prior to sputtering the at least one target at the substrate to be held by said substrate holder.

11. The sputtering device of claim 10, wherein said driving mechanism is operable to move at least one of said sputtering cathode units along an arcuate path across a surface of the substrate in a reciprocating manner for a plurality of passes during sputtering of the at least one target.

12. The sputtering device of claim 11, wherein said sputtering cathodes of each of said sputtering cathode units have the same type of target.

13. The sputtering device of claim 11, wherein said sputtering cathodes of each of said sputtering cathode units have different types of targets.

14. The sputtering device of claim 1, wherein said driving mechanism includes a plurality of arms extending in a radial direction from a rotation shaft, said driving mechanism being operable to rotate about a longitudinal axis of said rotation shaft, each of said sputtering cathode units being located at an end of a respective one of said arms.

15. The sputtering device of claim 14, further comprising a pre-sputtering unit for pre-sputtering the at least one target prior to sputtering the at least one target at the substrate to be held by said substrate holder.

16. The sputtering device of claim 15, wherein said driving mechanism is operable to move at least one of said sputtering cathode units along an arcuate path across a surface of the substrate in a reciprocating manner for a plurality of passes during sputtering of the at least one target.

17. The sputtering device of claim 16, wherein said sputtering cathodes of each of said sputtering cathode units have the same type of target.

18. The sputtering device of claim 16, wherein said sputtering cathodes of each of said sputtering cathode units have different types of targets.

19. The sputtering device of claim 1, wherein said plurality of sputtering cathode units are evenly spaced in a circular manner around a rotating shaft so that a center of each of said sputtering cathode units lies on a circle having said rotating shaft at a center thereof.

20. The sputtering device of claim 1, wherein each of said sputtering cathode units further includes a shield surrounding the targets of said sputtering cathodes, and includes a nozzle portion projecting from an end of said shield toward the substrate to be held by said substrate holder.

21. The sputtering device of claim 1, wherein all of said sputtering cathodes of said sputtering device are arranged so that said target of each of said sputtering cathodes faces the substrate to be held by said substrate holder.

* * * * *